(12) United States Patent
Kim et al.

(10) Patent No.: US 7,704,677 B2
(45) Date of Patent: Apr. 27, 2010

(54) METHOD OF PATTERNING CONDUCTIVE POLYMER LAYER, ORGANIC LIGHT EMITTING DEVICE, AND METHOD OF MANUFACTURING THE ORGANIC LIGHT EMITTING DEVICE

(75) Inventors: Sang-Yeol Kim, Gwacheon-si (KR); In-Nam Kang, Ansan-si (KR); Tae-Woo Lee, Seoul (KR); Bon-Won Koo, Suwon-si (KR); Sang-Hoon Park, Seongnam-si (KR); Yu-Jin Kim, Suwon-si (KR); Mu-Gyeom Kim, Hwaseong-si (KR); Jong-Jin Park, Guri-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1042 days.

(21) Appl. No.: 11/346,552

(22) Filed: Feb. 3, 2006

(65) Prior Publication Data

US 2006/0228906 A1 Oct. 12, 2006

(30) Foreign Application Priority Data

Feb. 3, 2005 (KR) .................... 10-2005-0010188

(51) Int. Cl.
*G03C 5/00* (2006.01)
*H01J 9/38* (2006.01)

(52) U.S. Cl. .............. 430/296; 430/319; 430/320; 430/942; 445/10; 445/11; 445/12; 445/24

(58) Field of Classification Search ............... 430/296, 430/319, 320, 942; 445/10, 11, 12, 24
See application file for complete search history.

(56) References Cited

U.S. PATENT DOCUMENTS

2004/0253368 A1* 12/2004 Tokuda .................. 427/64

FOREIGN PATENT DOCUMENTS

| KR | 1020030044562 | 6/2003 |
|----|---------------|--------|
| WO | 98/21755 | 5/1998 |

OTHER PUBLICATIONS

Office action from the Chinese Patent Office issued in Applicant's corresponding Chinese Patent Application No. 2006100060807.

* cited by examiner

*Primary Examiner*—Christopher G Young
(74) *Attorney, Agent, or Firm*—Robert E. Bushnell, Esq.

(57) ABSTRACT

A method of patterning a conductive polymer, an organic light emitting device (OLED) manufactured using the method of patterning a conductive polymer, and a method of manufacturing the OLED are provided. The method of patterning a conductive polymer includes forming a conductive polymer layer on a substrate, aligning a shadow mask above the conductive polymer layer, and forming a conductive polymer pattern area and an insulating area in the conductive polymer layer by radiating charged particle beams through the shadow mask.

20 Claims, 7 Drawing Sheets

200 X

METHOD OF PATTERNING CONDUCTIVE POLYMER LAYER, ORGANIC LIGHT EMITTING DEVICE, AND METHOD OF MANUFACTURING THE ORGANIC LIGHT EMITTING DEVICE

CROSS-REFERENCE TO RELATED PATENT APPLICATION AND CLAIM OF PRIORITY

This application claims the benefit of Korean Patent Application No. 10-2005-0010183, filed on Feb. 3, 2005, in the Korean Intellectual Property Office, the disclosure of which is incorporated herein in its entirety by reference.

BACKGROUND OF THE INVENTION

1. Field of the Invention

The present invention relates to a method of patterning a conductive polymer layer, an organic light emitting device (OLED), and a method of manufacturing the OLED, and more particularly, to a method of patterning a conductive polymer using a charged particle beam, an OLED manufactured by the method of patterning the conductive polymer using a charged particle beam, and a method of manufacturing the OLED.

2. Description of the Related Art

OLEDs have received much attention due to their suitability for color display devices. OLEDs are emissive display devices that emit light using an organic compound. They are thin, and compared to TFT-LCDs, have lower manufacturing costs, lower power consumption, and quicker response time, due to their simple structure and manufacturing process.

OLEDs are devices that transform electrical energy into optical energy in an organic material, to emit light by generating excitons by recombining holes and electrons respectively injected into an anode and a cathode of the organic material.

The OLED includes a metallic cathode, an emission material layer (EML, or a light emitting layer), and an anode, which are sequentially stacked on a basic stacking structure. The performance of the OLED is largely affected by the variation of a multi-layer thin film structure, and the light emitting efficiency and lifespan of the OLED can be improved by adding various functional layers, such as a hole transfer layer (HTL) and an electron transfer layer (ETL), to the basic structure.

The hole transfer layer (HTL) includes a hole injection layer (HIL), a hole transport layer (HTL), and/or a electron blocking layer (EBL). The hole transfer layer (HTL) may be formed of electron donor molecules having low ionization potential to facilitate the hole injection into the hole transfer layer (HTL) from the anode. If the hole transfer layer (HTL) is formed of triphenyldiamine (TPD) monomer and the TPD monomer is exposed to heat for many hours, the TPD monomer crystallizes and loses its hole transferring characteristics, since the TPD monomer has low thermal stability. Therefore, conductive polymers having high thermal stability and conductivity, such as polyethylenedioxythiophene (PEDOT) or polyaniline (PANI), are used for forming the hole transferring material. Also, to use the OLED as a display device, a method of patterning a conductive polymer layer through a photo process after spin-coating the conductive polymer layer on a substrate has been considered.

FIG. 1 is a perspective view illustrating a conventional method of patterning a conductive polymer for an OLED (refer to Korean Patent No. 2003-044562).

Referring to FIG. 1, the conventional patterning method includes forming a PEDOT layer 120 on a glass substrate 110 by spin-coating, and forming an insulating layer 150 and a hole transport layer (HTL) 140 by radiating high-energy UV rays or X-rays through a photomask 130 onto the glass substrate 110 on which a PEDOT layer 120 is coated.

The conventional method of patterning a conductive polymer forms a conductive polymer pattern using the photomask 130 by radiating high-energy photons, such as UV rays or X-rays.

The conventional method of patterning a conductive polymer uses photons, which have the characteristics of refracting, reflecting, and interfering. It is difficult to control the photons passing through the photomask 130, and an imperfect pattern may be formed due to wave guiding of the photons. When the gap between the photomask 130 and the PEDOT layer 120 is reduced to reduce the wave guiding of the photons, the PEDOT layer 120 can be contaminated by contacting the photomask 130. Furthermore, the conventional method of using high-energy photons to pattern a conductive polymer has a high power consumption.

SUMMARY OF THE INVENTION

The present invention provides a method of patterning a conductive polymer that can form a precise pattern, can reduce contamination of a conductive polymer layer, and has relatively low power consumption.

According to an aspect of the present invention, there is provided a method of patterning a conductive polymer comprising: forming a conductive polymer layer on a substrate; aligning a shadow mask above the conductive polymer layer; and forming a conductive polymer pattern area and an insulating area in the conductive polymer layer by radiating charged particle beams through the shadow mask. The conductive polymer layer may be formed of a conjugated polymer.

The insulating area may be an insulating polymer layer onto which the charged particle beams are radiated, and the conductive polymer pattern area may be the conductive polymer layer onto which the charged particle beams are not radiated. The conductive polymer pattern layer may be used as a hole injection layer (HIL) or a hole transport layer (HTL). The charged particles may be electrons or ions. The ions may be ions of a material selected from the group consisting of H, Li, Na, K, Rb, Fr, F, Cl, Br, I, At, Ne, Kr, Xe, Rn, He, Ar, N, O, and Cs.

The method of patterning a conductive polymer may be applied to any display devices having a conductive polymer pattern, such as an OLED and an organic TFT display device.

According to another aspect of the present invention, there is provided a method of manufacturing an OLED, which includes: an anode formed on a substrate; a conductive polymer pattern area and an insulating area located on the anode; a light emitting layer covering the conductive polymer pattern area and the insulating area; and a cathode located on the light emitting layer, the method comprising: forming the anode on the substrate; forming the conductive polymer layer on the anode; aligning a shadow mask above the conductive polymer layer; forming the conductive polymer pattern area and the insulating area in the conductive polymer layer by radiating charged particle beams through the shadow mask; forming the light emitting layer on the conductive polymer pattern area and the insulating area; and forming the cathode on the light emitting layer. The conductive polymer layer may be formed of a conjugated polymer.

The insulating area may be an insulating polymer layer onto which the charged particle beams are radiated, and the conductive polymer pattern area may be the conductive polymer layer onto which the charged particle beams are not radiated. The charged particles may be electrons or ions. The ions may be ions of a material selected from the group consisting of H, Li, Na, K, Rb, Fr, F, Cl, Br, I, At, Ne, Kr, Xe, Rn, He, Ar, N, O, and Cs.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
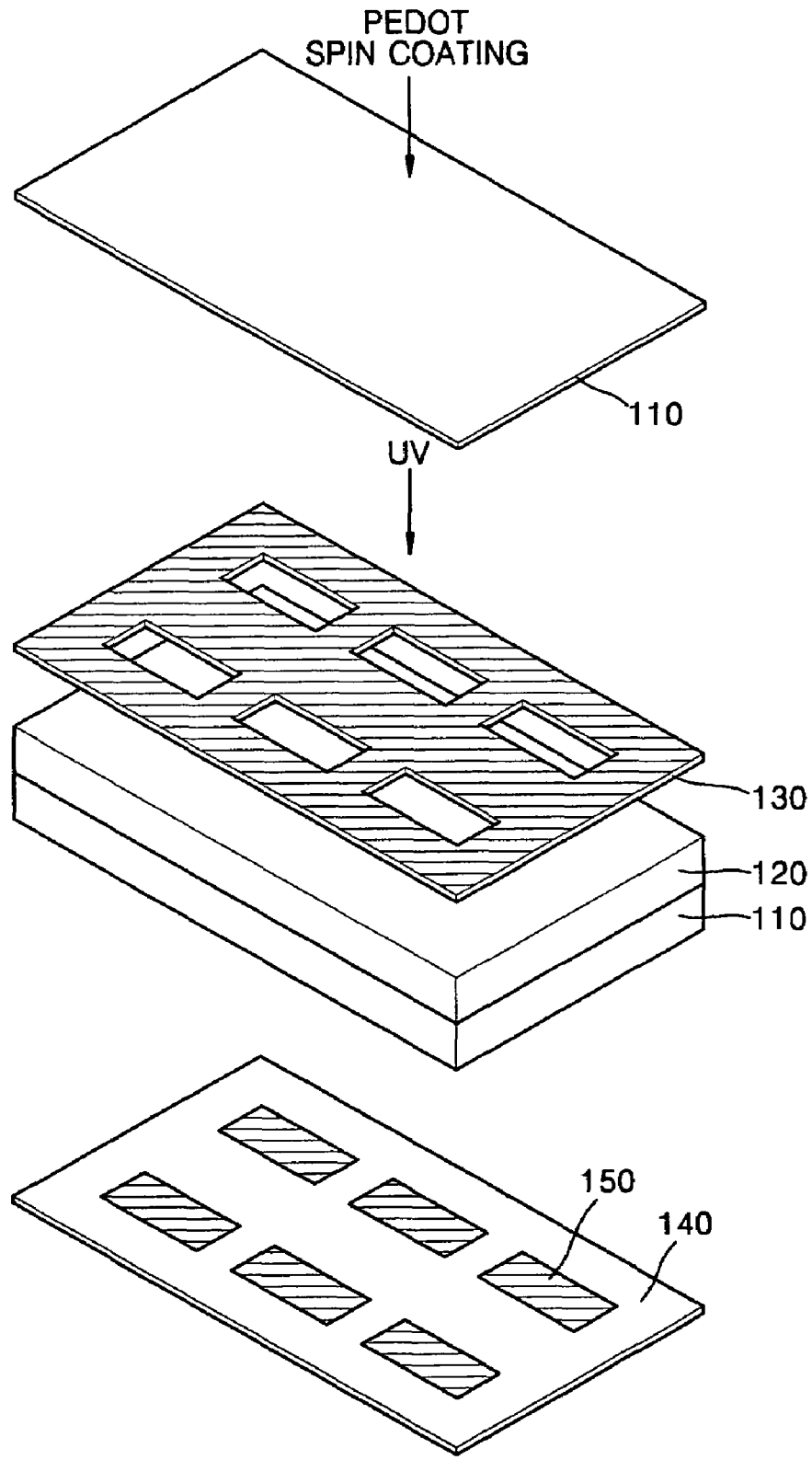
FIG. 1 is a perspective view illustrating a conventional method of patterning a conductive polymer.

A method of patterning a conductive polymer according to the present invention will now be described more fully with reference to the accompanying drawings, in which exemplary embodiments of the invention are shown. In the drawings, the thicknesses of layers and regions are exaggerated for clarity.

FIGS. 2A through 2D are cross-sectional views illustrating a method of patterning a conductive polymer according to an embodiment of the present invention.

Figure 2A:
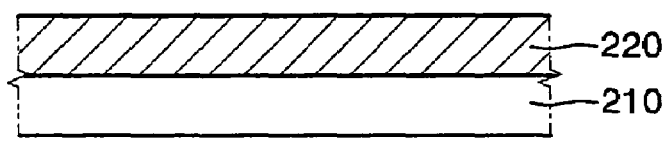
FIGS. 2A through 2D are cross-sectional views illustrating a method of patterning a conductive polymer according to an embodiment of the present invention.
Figure 2B:
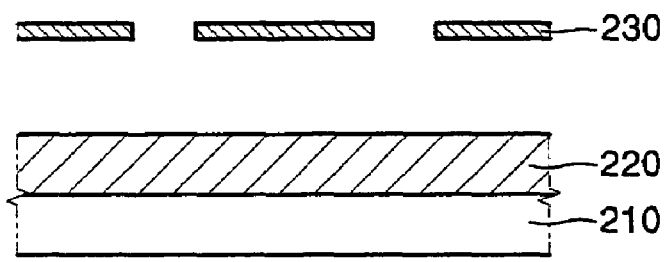
Figure 2C:
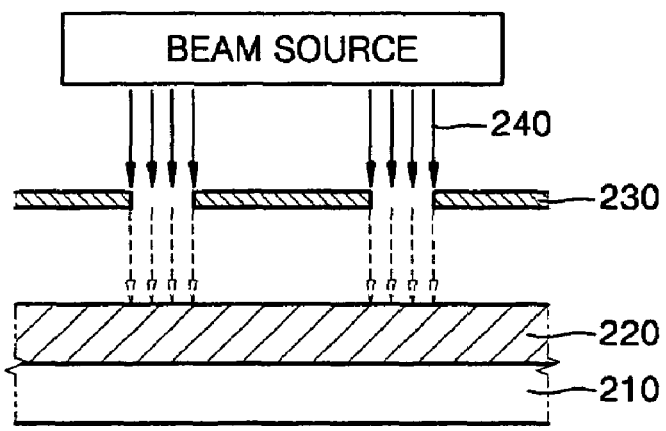

Referring to FIGS. 2A through 2D, the method of patterning a conductive polymer includes: forming a conductive polymer layer 220 on a substrate 210 (see FIG. 2A); aligning a shadow mask 230 above the conductive polymer layer 220 with a gap between the conductive polymer layer 220 and the shadow mask 230 (see FIG. 2B); and forming an insulating area 260 and a conductive polymer pattern area 250 by radiating charged particle beams 240 onto the conductive polymer layer 220 through the shadow mask 230 (see FIG. 2C).

More specifically, referring to FIG. 2A, the conductive polymer layer 220 is formed on the substrate 210 by a wet process, such as spin-coating, dip coating, roll coating, or an inkjet method. Here, the conductive polymer layer 220 is formed of a conjugated polymer, such as polyethylenedioxythiophene (PEDOT) or polyaniline (PANI). The substrate 210 may be formed of a transparent material, such as glass, quartz, or organic polymer compound.

Referring to FIG. 2B, the shadow mask 230 is aligned above the conductive polymer layer 220. At this time, the gap between the conductive polymer layer 220 and the shadow mask 230 does not need to be narrow, since the charged particle beams 240 are radiated onto the conductive polymer layer 220 when the conductive polymer pattern layer 250 is formed.

Referring to FIG. 2C, the charged particle beams 240 are radiated from a beam source above the aligned shadow mask 230, and bombarded onto the conductive polymer layer 220. The charged particles can be electrons or ions, and the ions can be ions of a material selected from the group consisting of H, Li, Na, K, Rb, Fr, F, Cl, Br, I, At, Ne, Kr, Xe, Rn, He, Ar, N, O, and Cs. Preferably, the ions can be ions of a material selected from H, He, Ar, N, O, and Cs.

Figure 2D:
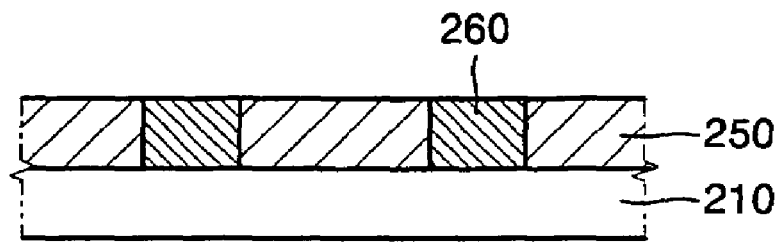

FIG. 2D shows the process result of FIG. 2C. Referring to FIG. 2D, the conductive polymer layer 220 is divided into the insulating area 260 onto which the charged particle beams 240 are radiated and the conductive polymer pattern area 250 onto which the charged particle beams 240 are not radiated after the charged particle beams 240 are radiated onto the conductive polymer layer 220 with the shadow mask. The conductive polymer pattern layer 250 can be used as a hole injection layer (HIL) or a hole transport layer (HTL).

Figure 3:
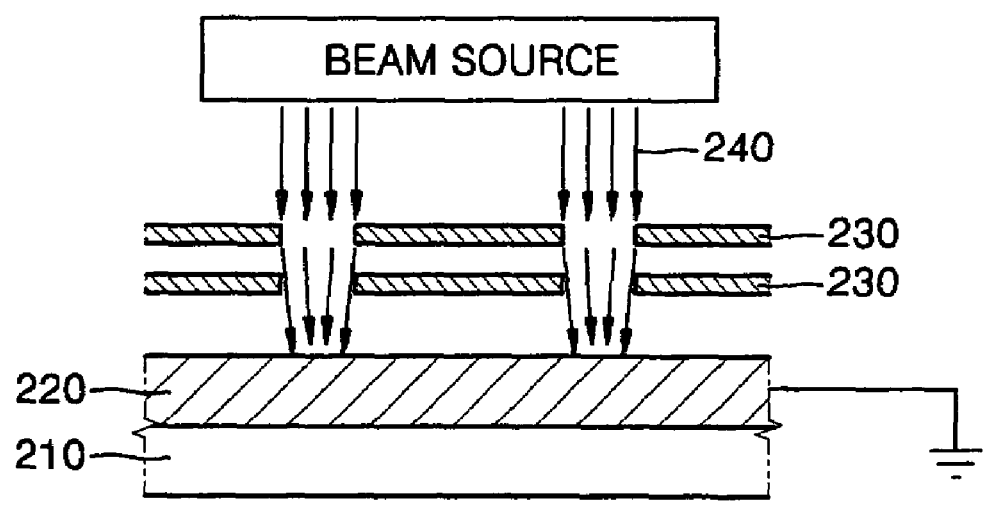
FIG. 3 is a cross-sectional view illustrating the focusing of charged particle beams when the charged particle beams pass through a charged shadow mask.

FIG. 3 is a modified version of FIG. 2C, and illustrates a method of patterning when a potential is applied to the shadow mask 230. One or more shadow masks 230 can be provided. Referring to FIG. 3, the charged particle beams 240 can be focused on the conductive polymer layer 220 after passing through the shadow mask 230 by appropriately aligning the shadow masks 230 having stepwise potential. This method can be applied to manufacture a high resolution device that requires precision patterning.

Figure 4A:
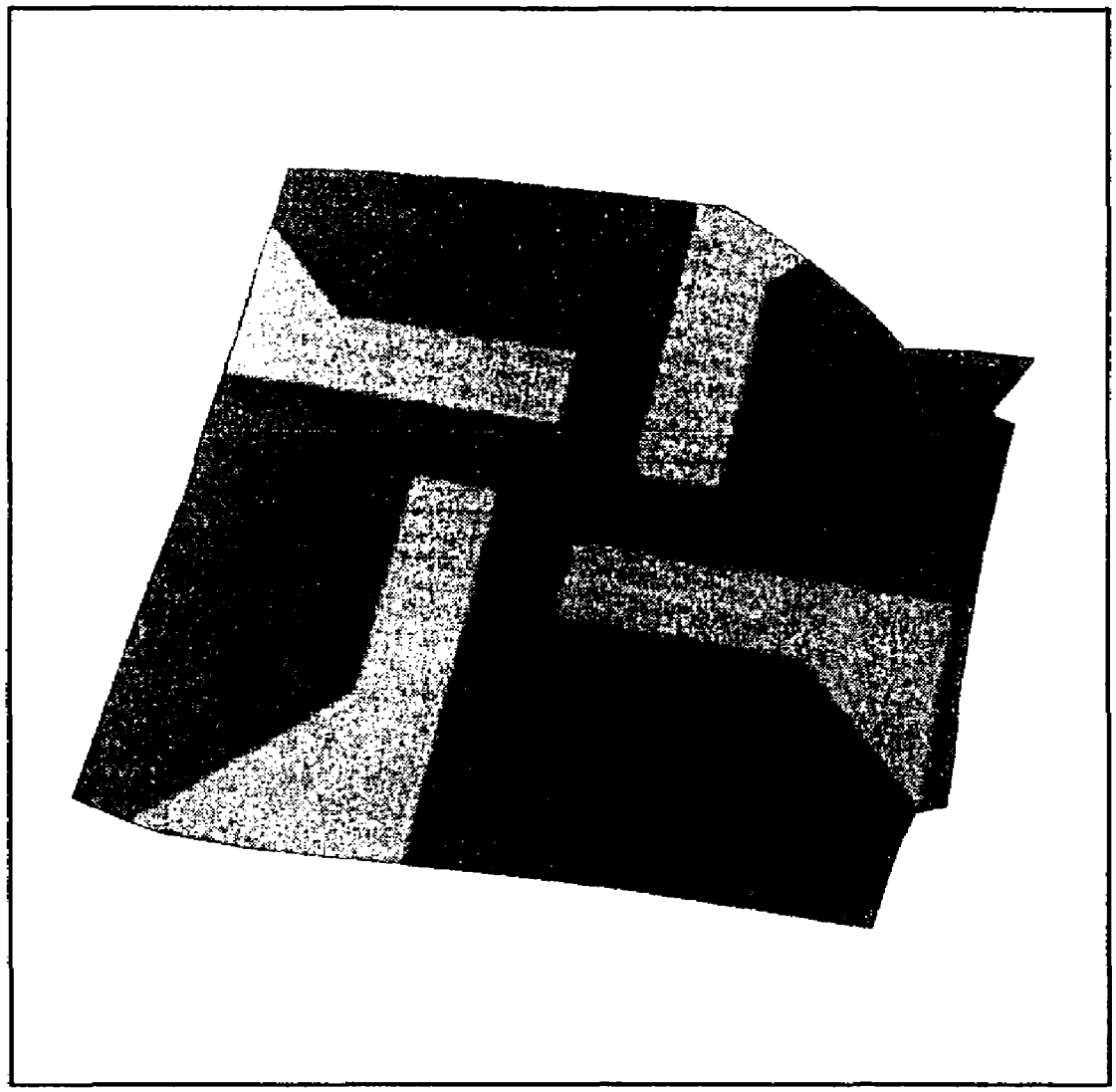
FIGS. 4A through 4C are photographs of light emission from a conductive polymer layer manufactured according to an embodiment of the present invention.
Figure 4B:
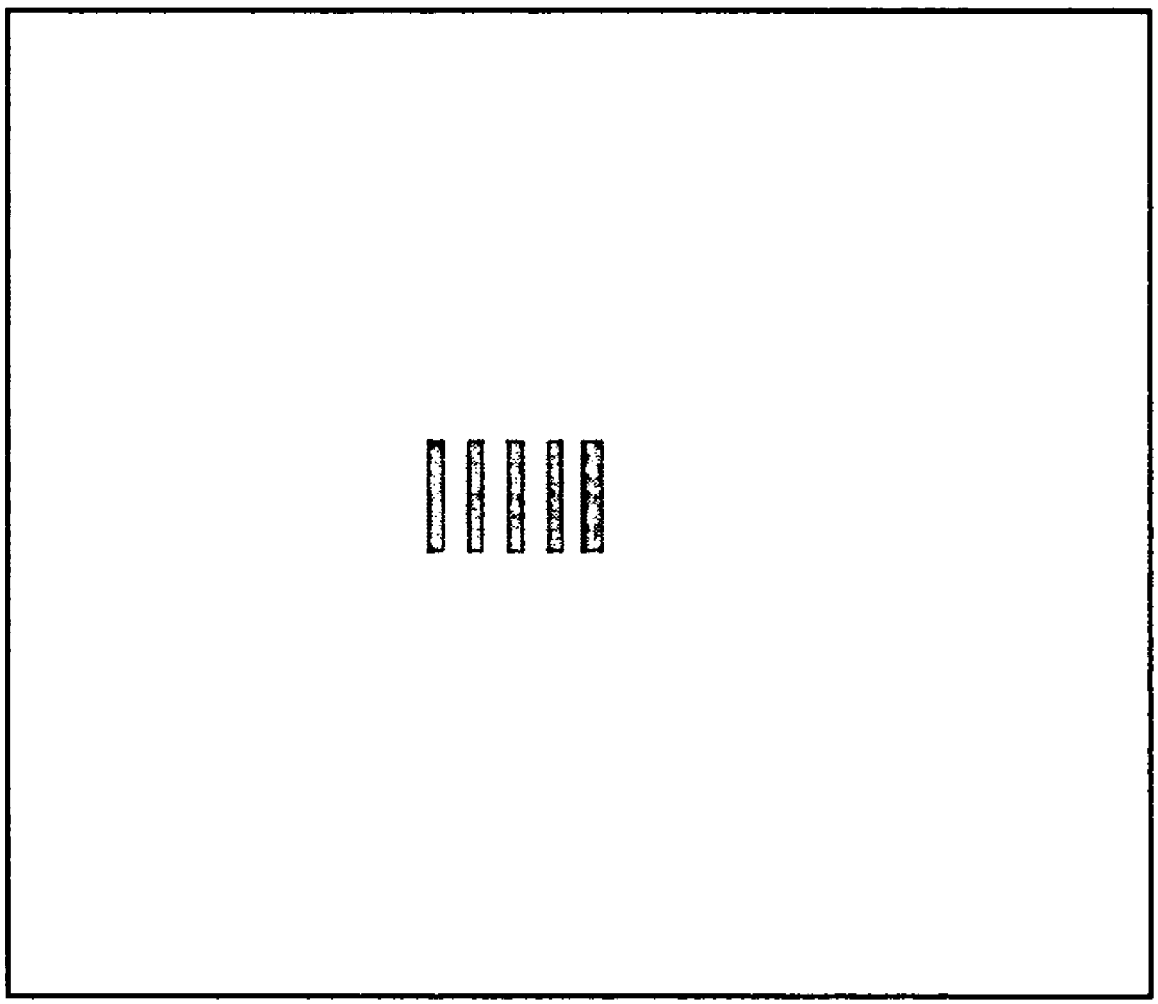
Figure 4C:
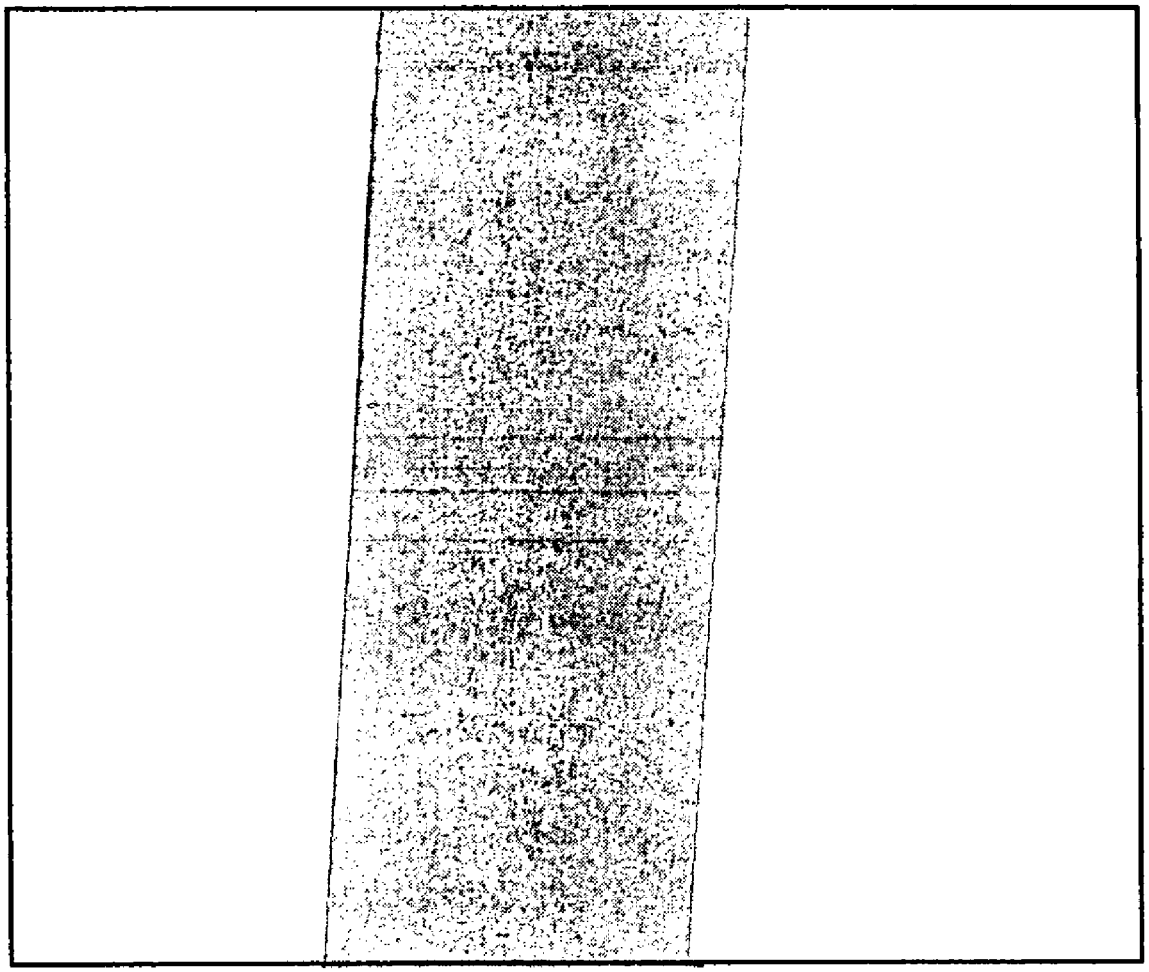

FIGS. 4A through 4C are photographs of light emission from a conductive polymer layer manufactured according to an embodiment of the present invention.

FIG. 4A is a photograph showing the light emission from a light emitting device before the light emitting device is patterned. FIG. 4B is a photograph showing the light emission from a light emitting device patterned by the method of patterning according to the present invention, and FIG. 4C is a photograph of the pattern layer enlarged 200 times. Referring to FIG. 4C, the emitted light from the surface of the pattern layer is uniform, and the boundary lines of the pattern are clear. That is, the wave guiding by the charged particle beams is reduced.

Figure 5:
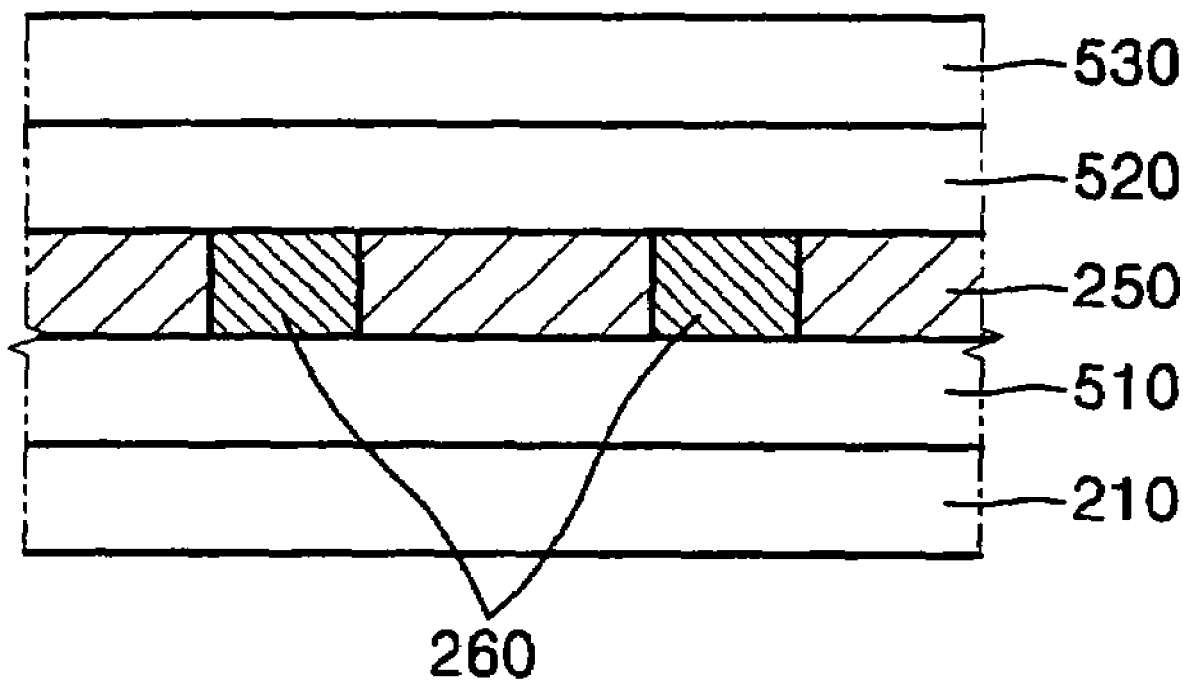
FIG. 5 is a cross-sectional view illustrating an OLED having a conductive polymer pattern area formed according to an embodiment of the present invention.

FIG. 5 is a cross-sectional view illustrating an OLED having a conductive polymer pattern layer formed according to an embodiment of the present invention.

Referring to FIG. 5, an OLED includes: an anode 510 located on the substrate 210; the conductive polymer pattern area 250 and the insulating area 260 located on the anode 510; a light emitting layer 520 covering the conductive polymer pattern area 250 and the insulating area 260; and a cathode 530 located on the light emitting layer 520. A method of manufacturing the OLED includes: forming the anode 510 on the substrate 210; forming a conductive polymer layer on the anode 510; aligning a shadow mask above the conductive polymer layer; forming the conductive polymer pattern area 250 and the insulating area 260 by radiating charged particle beams onto the conductive polymer layer through the shadow mask; forming the light emitting layer 520 on the conductive polymer pattern area 250 and the insulating area 260; and forming the cathode 530 on the light emitting layer 520.

In the present invention, surface contamination of the conductive polymer pattern area 250 by contact between the shadow mask 230 and the conductive polymer layer 220 and imperfect patterning due to the wave guiding can be reduced, since the charged particle beams 240 are used for patterning the conductive polymer layer 220. When the shadow masks 230 having stepwise potentials are appropriately aligned, the charged particle beams 240 radiated from a beam source can be focused. And, the charged particle beams 240 reduce the energy consumption, in comparison with the high-energy photon beams.

The embodiment of the present invention will now be described in detail, but the present invention is not limited thereto.

EXAMPLE 1

A Method of Manufacturing a Patterned OLED

A transparent electrode substrate is formed by coating indium-tin oxide (ITO) on a glass substrate. After cleaning the transparent electrode substrate, the surface of the transparent electrode substrate is treated with UV-Ozone for 15 minutes.

Baytron P AI4083 (Bayer Co.) (commercial name is PEDOT) is coated on the upper part of the ITO electrode to a thickness of 50-110 nm. A hole transport layer (HTL) is formed by baking the resultant product at a temperature of 110° C. for approximately 10 minutes.

The transparent electrode substrate, on which the hole transport layer (HTL) is coated, is patterned by radiating an electron beam of 100 eV using a shadow mask in a vacuum chamber maintained at a pressure of approximately $1 \times 10^{-6} \sim 1 \times 10^{-7}$ torr.

Afterward, a composite solution for forming a light emitting layer is made by dissolving TS-9, which is polyfluorene polymer, in a solvent, i.e. 10 g chlorobenzene. The composite solution is filtered using a 0.2 μm filter and then coated on the upper part of the hole transport layer (HTL) using spin-coating. After baking the resultant product, the light emitting layer is formed by completely removing the solvent in a vacuum oven. The thickness of the light emitting layer is controlled to the range of 50-100 nm by controlling the concentration and spinning speed of the composite solution.

The manufacturing of the OLED is completed by sequentially depositing Ca and Al on the upper part of the light emitting layer while the vacuum chamber is maintained at a pressure of $1 \times 10^{-6}$ torr or less. The thickness and growing speed of the films are controlled using a crystal sensor.

The OLED manufactured according to the method described above is a multi-layer device having a structure of ITO/hole transport layer (HTL)/light emitting polymer/Ca/Al, and the light emission of a patterned device is the same as the photographs shown in FIGS. 4B and 4C.

As described above, the method of patterning a conductive polymer according to the present invention forms a precise pattern, reduces contamination of the conductive polymer layer, and consumes a relatively low energy, since the method uses charged particle beams and shadow masks.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of patterning a conductive polymer, comprising:
    forming a conductive polymer layer on a substrate;
    aligning a shadow mask above the conductive polymer layer; and
    forming a conductive polymer pattern area and an insulating area in the conductive polymer layer by radiating charged particle beams through the shadow mask.

2. The method of claim 1, wherein the conductive polymer layer is formed of a conjugated polymer.

3. The method of claim 1, wherein the insulating area is formed on a portion of the conductive polymer layer onto which the charged particle beams are radiated.

4. The method of claim 1, wherein the charged particle beams are one of electrons and ions.

5. The method of claim 4, wherein the ions are ions of a material selected from the group consisting of H, Li, Na, K, Rb, Fr, F, Cl, Br, I, At, Ne, Kr, Xe, Rn, He, Ar, N, O, and Cs.

6. A patterned conductive polymer formed by using the method of claim 1.

7. An organic light emitting device comprising a hole injection layer, a hole transport layer, and a light emitting layer, wherein at least one of the hole injection layer, the hole transport layer, and the light emitting layer is formed of the patterned conductive polymer of claim 6.

8. A method of patterning a conductive polymer, the method comprising:
    forming a conductive polymer layer on a substrate;
    aligning a mask having a patterned hole above the conductive polymer layer; and
    radiating charged particle beams through the patterned hole of the mask to form a patterned conductive polymer.

9. The method of claim 8, wherein the conductive polymer layer is formed of a conjugated polymer.

10. The method of claim 8, wherein a radiated area of the conductive polymer layer forms an insulating polymer layer.

11. The method of claim 8, wherein the charged particle beams are one of electrons and ions.

12. The method of claim 11, wherein the ions are ions of a material selected from the group consisting of H, Li, Na, K, Rb, Fr, F, Cl, Br, I, At, Ne, Kr, Xe, Rn, He, Ar, N, O, and Cs.

13. The method of claim 8, wherein the mask is a shadow mask.

14. The method of claim 8, wherein the mask comprises a plurality of shadow masks.

15. The method of claim 14, wherein the plurality of shadow masks have stepwise potential.

16. A method of manufacturing an organic light emitting device, the method comprising:
    forming an anode on a substrate;
    forming a conductive polymer layer on the anode;
    aligning a shadow mask above the conductive polymer layer;
    forming a conductive polymer pattern area and an insulating area in the conductive polymer layer by radiating charged particle beams through the shadow mask;
    forming a light emitting layer on the conductive polymer pattern layer and the insulating area; and
    forming a cathode on the light emitting layer.

17. The method of claim 16, wherein the conductive polymer layer is formed of a conjugated polymer.

18. The method of claim 16, wherein the insulating area is formed on a portion of the conductive polymer layer onto which the charged particle beams are radiated.

19. The method of claim 16, wherein the particles are one of electrons and ions.

20. The method of claim 19, wherein the ions are ions of a material selected from the group consisting of H, Li, Na, K, Rb, Fr, F, Cl, Br, I, At, Ne, Kr, Xe, Rn, He, Ar, N, O, and Cs.

* * * * *